United States Patent
Takeuchi et al.

(10) Patent No.: US 6,826,442 B2
(45) Date of Patent: Nov. 30, 2004

(54) STOCKER, EXPOSURE APPARATUS, DEVICE MANUFACTURING METHOD, SEMICONDUCTOR MANUFACTURING FACTORY, AND EXPOSURE APPARATUS MAINTENANCE METHOD

(75) Inventors: Seiji Takeuchi, Tochigi (JP); Eiichi Murakami, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 161 days.

(21) Appl. No.: 09/819,670

(22) Filed: Mar. 29, 2001

(65) Prior Publication Data

US 2001/0027351 A1 Oct. 4, 2001

(30) Foreign Application Priority Data

Mar. 30, 2000 (JP) .................................... 2000-094374

(51) Int. Cl.[7] ............................................. G06F 19/00
(52) U.S. Cl. .................. 700/121; 204/298.25; 118/719
(58) Field of Search ................. 700/121, 214; 118/719; 204/298.25; 414/217

(56) References Cited

U.S. PATENT DOCUMENTS

| | | | | |
|---|---|---|---|---|
| 5,407,350 A | * | 4/1995 | Iwabuchi et al. | 432/241 |
| 5,433,785 A | * | 7/1995 | Saito | 118/719 |
| 5,573,891 A | * | 11/1996 | Sato et al. | 430/323 |
| 5,829,939 A | * | 11/1998 | Iwai et al. | 414/411 |
| 6,134,482 A | * | 10/2000 | Iwasaki | 700/121 |
| 6,451,507 B1 | * | 9/2002 | Suenaga et al. | 430/311 |
| 6,487,472 B1 | * | 11/2002 | Song et al. | 700/121 |

* cited by examiner

Primary Examiner—Leo Picard
Assistant Examiner—Alexander Kosowski
(74) Attorney, Agent, or Firm—Fitzpatrick, Cella, Harper & Scinto (57) ABSTRACT

A stocker includes a first sealing member for stocking an object to be stocked, an atmosphere control device for controlling an internal atmosphere of the first sealing member to a first atmosphere of an inert gas, and a transfer device for transporting an object to be stocked to an exposure apparatus using an $F_2$ excimer laser or receiving the object to be stocked from the exposure apparatus while the object to be stocked is shielded from an external atmosphere of the first sealing member.

14 Claims, 10 Drawing Sheets

```
URL  http://www.maintain.co.jp/db/input.html

TROUBLE DB INPUT WINDOW

OCCURRENCE DATE    2000/3/15  ~404
TYPE OF APPARATUS  **********  ~401
SUBJECT            OPERATION ERROR (START-UP ERROR)  ~403
SERIAL NUMBER S/N  465NS4580001  ~402
DEGREE OF URGENCY  D  ~405
SYMPTOM   LED IS KEPT FLICKERING AFTER
          POWER-ON                                ~406

REMEDY    POWER ON AGAIN
          (PRESS RED BUTTON IN ACTIVATION)        ~407

PROGRESS  INTERIM HAS BEEN DONE                   ~408

(SEND)(RESET)       416              417                418
LINK TO RESULT LIST DATABASE   SOFTWARE LIBRARY   OPERATING GUIDE
```

STOCKER, EXPOSURE APPARATUS, DEVICE MANUFACTURING METHOD, SEMICONDUCTOR MANUFACTURING FACTORY, AND EXPOSURE APPARATUS MAINTENANCE METHOD

FIELD OF THE INVENTION

The present invention relates to a stocker for stocking an object to be stocked such as a reticle or wafer in a semiconductor manufacturing process, an exposure apparatus having the stocker, a device manufacturing method, a semiconductor manufacturing factory, and an exposure apparatus maintenance method and, more particularly, to a stocker for an object to be stocked in an exposure apparatus using an $F_2$ excimer laser as an exposure light source.

BACKGROUND OF THE INVENTION

In recent years, the wavelength of an exposure light source used in an exposure apparatus is becoming much shorter in the manufacture of a semiconductor device. A short wavelength increases the resolution of a projection, exposure system concerning exposure, which enables exposure of a finer pattern. An $F_2$ excimer laser has a wavelength as short as 157 nm, and is being applied to an exposure apparatus. The wavelength of 157 nm falls within a wavelength region generally called a vacuum ultraviolet region. In this wavelength region, light is greatly absorbed by oxygen molecules and hardly passes through outer air. Thus, the $F_2$ excimer laser can be applied in only an environment in which the atmospheric pressure is decreased to almost vacuum and the oxygen concentration is sufficiently decreased. According to a reference "Photochemistry of Small Molecules" (Hideo Okabe, A Wiley-Interscience Publication, 1978, page 178), the absorption coefficient of oxygen with respect to light having a wavelength of 157 nm is about 190 $atm^{-1}cm^{-1}$. This means that a transmittance T per cm is only $T=\exp(-190 \times 1 \text{ cm} \times 0.01 \text{ atm})=0.150$ when light having a wavelength of 157 nm passes through gas having an oxygen concentration of 1% at one atmospheric pressure.

Japanese Patent Publication 5-66733 discloses an interface apparatus for an integrated circuit. This apparatus relates to a box for storing integrated circuit wafers and an interface for the wafers in the box. The earlier publication also discloses exchange of wafers so as to inhibit entrance of foreign matter such as dust.

In an exposure apparatus using an $F_2$ excimer laser, absorption by oxygen at a wavelength of 157 nm is conspicuous. To obtain a satisfactory transmittance, the oxygen concentration must be reduced to 1 ppm or less, and the concentration must be strictly controlled. Members which are frequently loaded/unloaded into/from the exposure apparatus are wafers and reticles (including masks), which are usually stocked in a clean room or the like. The oxygen concentration cannot be satisfactorily reduced even by arranging a mechanism for reducing oxygen in transporting a wafer or reticle to the exposure apparatus. Such a mechanism becomes an oxygen mixing source into the exposure apparatus, and decreases the yield of the exposure apparatus.

SUMMARY OF THE INVENTION

The present invention has been made in consideration of the above situation, and has as its object to stock a reticle or wafer in an atmosphere in which the oxygen concentration is reduced to about 5 ppm before the reticle or wafer is transferred to an exposure apparatus.

It is another object of the present invention to transport a reticle or wafer in an oxygen-concentration-reduced atmosphere to an exposure apparatus without exposing the reticle or wafer to outer air.

To achieve the above objects, according to the present invention, a stocker for stocking an object to be stocked such as a reticle, mask, or wafer has the following arrangement.

According to the first arrangement, a stocker comprises a first sealing member, atmosphere control means for controlling an internal atmosphere of the first sealing member to a first atmosphere, and transfer means for transporting an object to be stocked to an exposure apparatus or receiving the object to be stocked from the exposure apparatus without exposing the objects to be stocked to an external atmosphere of the first sealing member, wherein at least one object to be stocked is stocked in the first sealing member.

According to the second arrangement, a stocker comprises a first sealing member, first atmosphere control means for controlling an internal atmosphere of the first sealing member to a first atmosphere, a second sealing member for storing at least one object to be stocked, second atmosphere control means for controlling an internal atmosphere of the second sealing member to a second atmosphere, and transfer means for transporting the object to be stocked to an exposure apparatus or receiving the object to be stocked from the exposure apparatus while the object to be stocked is stored in the second sealing member without being exposed to an external atmosphere of the first sealing member, wherein at least one second sealing member, which stores at least on object to be stocked, is stocked in the first sealing member.

The stocker of the present invention may further comprise a load-lock chamber. In this case, the object to be stocked is transported to the outside of the first sealing member or received from the outside of the first sealing member via the load-lock chamber, At this time, the object to be stocked is preferably transported to the outside of the first sealing member or received from the outside of the first sealing member while stored in the second sealing member.

The stocker may further comprise atmosphere measurement means such as oxygen analyzers for measuring the internal atmospheres of the first sealing member and/or the second sealing member. In the first arrangement, it is desirable that the first atmosphere have an oxygen concentration of 50 ppm or less. In the second arrangement, it is desirable that the first atmosphere have an oxygen concentration of 50 ppm or less and the second atmosphere have an oxygen concentration of 5 ppm or less. In either case, the first and second atmospheres are usually an inert gas atmosphere, and preferably, a nitrogen gas atmosphere, a helium gas atmosphere, or a gas mixture atmosphere of nitrogen gas and helium gas. For this purpose, the atmosphere control means preferably has gas injection means for injecting inert gas or the like, or evacuation means for discharging gas from the stocker.

The stocker of the present invention is desirably connected to the exposure apparatus via a highly airtight transfer path, and is suitable for an exposure apparatus using an $F_2$ excimer laser as an exposure light source.

For example, transfer means for transporting the object to be stocked to manufacturing apparatuses for performing various processes or receiving the object to be stocked from the manufacturing apparatuses for performing various processes is desirably arranged in a semiconductor manufacturing line.

In a reticle or mask stocker, a desired one of stocked reticles or masks is supplied to the exposure apparatus by, e.g., a reticle changer.

With this arrangement, the object to be stocked can be transported to the exposure apparatus without being exposed to outer air while the oxygen concentration in the stocker is maintained at 50 ppm or less and, especially, the oxygen concentration around the substrate such as a reticle or wafer is maintained at about 5 ppm. The oxygen concentration can be quickly reduced to 1 ppm or less by loading the object to be stocked into the exposure apparatus via, e.g., the load-lock chamber. The evacuation means is adopted to repeat discharge and gas injection, which can reduce the oxygen concentration to about 5 ppm faster than the case of only gas injection. Particularly, in an exposure apparatus using an $F_2$ excimer laser as a light source, a high-quality semiconductor device can be manufactured while absorption of a laser beam is reduced and the yield is kept high.

An exposure apparatus of the present invention for transferring a pattern drawn on a reticle or mask to the wafer by exposure comprises a stocker having the above features in order to stock substrates such as reticles, masks, or wafers.

The exposure apparatus of the present invention further comprises a display, a network interface, and a computer for executing network access software. This enables communicating maintenance information of the exposure apparatus via a computer network. The network software is connected to an external network of a factory in which the exposure apparatus is installed, provides on the display a user interface for accessing a maintenance database provided by a vendor or user of the exposure apparatus, and enables obtaining information from the database via the external network.

A device manufacturing method of the present invention comprises the steps of installing manufacturing apparatuses, for performing various processes, including an exposure apparatus, in a semiconductor manufacturing factory, and manufacturing a semiconductor device in a plurality of processes by using the manufacturing apparatuses. The device manufacturing method may further comprise the steps of connecting the manufacturing apparatuses by a local area network, and communicating information about at least one of the manufacturing apparatuses between the local area network and an external network of the semiconductor manufacturing factory. It may also be possible that maintenance information of the manufacturing apparatus is acquired by data communication by accessing via the external network a database provided by a vendor or user of the exposure apparatus, or production is managed by data communication via the external network with a semiconductor manufacturing factory other than the semiconductor manufacturing factory.

A semiconductor manufacturing factory of the present invention comprises manufacturing apparatuses, for performing various processes, including the exposure apparatus of the present invention, a local area network for connecting the manufacturing apparatuses, and a gateway for allowing the local area network to access an external network of the factory, wherein information about at least one of the manufacturing apparatuses is communicated.

A maintenance method for the exposure apparatus of the present invention comprises the steps of causing a vendor or user of the exposure apparatus to provide a maintenance database connected to an external network of the semiconductor manufacturing factory, authenticating access from the semiconductor manufacturing factory to the maintenance database via the external network, and transmitting maintenance information accumulated in the maintenance database to the semiconductor manufacturing factory via the external network.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Preferred embodiments of the present invention will be described.

First Embodiment

Figure 1:
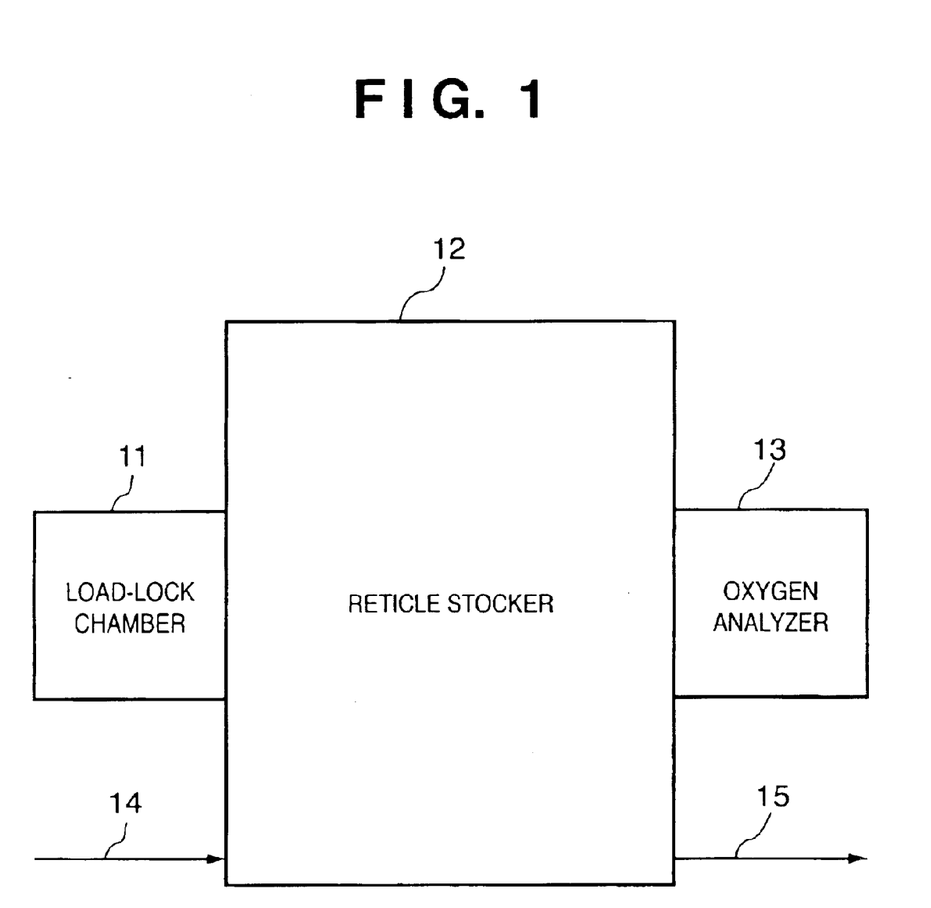
FIG. 1 is a block diagram showing a stocker according to the first embodiment of the present invention.

FIG. 1 shows a reticle stocker according to the first embodiment of the present invention. In FIG. 1, reference numeral 11 denotes a load-lock chamber; 12, a reticle stocker; 13, an oxygen analyzer; 14, a nitrogen injection port; and 15, a discharge port. In the first embodiment, nitrogen is injected from the nitrogen injection port at a desired flow rate. The discharge port 15 may be kept open. The flow rate of injected nitrogen is controlled to keep the interior of the reticle stocker 12 at a higher positive pressure than the outside. The flow rate is controlled in accordance with the internal oxygen concentration. When the oxygen concentration after release to outer air is high, nitrogen equal to the volume of the reticle stocker 12 is supplied, and after the oxygen concentration is reduced to about 5 ppm, the flow rate is decreased. It may also be possible to increase the airtightness of the injection port 14, discharge port 15, and reticle stocker 12, and to maintain the inside at a lower pressure than the atmospheric pressure. The oxygen analyzer 13 always monitors the oxygen concentration in the reticle stocker 12. If the oxygen analyzer 13 detects an oxygen concentration of 5 ppm or more, the nitrogen flow rate is controlled to be increased so as to reduce the concentration again. An exposure apparatus (not shown) comprises the load-lock chamber 11, and exchanges a reticle or wafer via the load-lock chamber 11 so as to inhibit mixture of oxygen or any impurity into the exposure apparatus. To reduce oxygen in the exposure apparatus to 1 ppm or less by one passage through the load-lock chamber 11, the oxygen concentration is preferably reduced to 5 ppm or less in the stocker on the preceding stage. Depending on the performance of the load-lock chamber 11, the oxygen concentration can be reduced to 1 ppm or less by atmosphere replacement before the exposure apparatus even if an oxygen concentration of about 10 ppm is permitted in the stocker.

As a criterion of reducing the nitrogen flow rate and oxygen concentration, injection of nitrogen at 6 L/min into a reticle stocker having a volume of 30 L decreases the oxygen concentration to about 5 ppm within about 2 h from a state wherein the reticle stocker contains normal outer air. The reticle stocker maintains this oxygen concentration by continuously supplying nitrogen. The oxygen concentration can be reduced within a shorter time by supplying a larger amount of nitrogen.

The stocking forms of the reticle stocker include stocking only a reticle, a reticle cassette for storing one reticle, and a reticle box for storing a plurality of reticle cassettes. The reticle cassette and box are designed with higher airtightness than that of a conventional reticle cassette and a box for shielding foreign matter such as dust, and will be referred to as a highly airtight reticle cassette and box hereinafter.

A reticle is loaded into the reticle stocker 12 via the load-lock chamber 11 together with the highly airtight reticle cassette or box or by itself. The load-lock chamber 11 basically enables loading the reticle into the reticle stocker 12 while preventing an increase in oxygen concentration. In practice, oxygen at the ppm level is mixed because it is difficult to remove oxygen left at the reticle itself or the fine structure of the highly airtight reticle cassette or box. For this reason, the oxygen concentration of the reticle stocker 12 increases at the ppm level temporarily or gradually after receiving the reticle. However, the residual oxygen diffuses with the elapse of time during stocking and is diluted by the flow of nitrogen, thus reducing the oxygen concentration again.

The highly airtight reticle cassette or box is opened to replace the internal atmosphere by nitrogen in passing through the load-lock chamber 11. To remove the residual oxygen by diffusion, the highly airtight reticle cassette or box is also opened in the reticle stocker 12.

In the use of a reticle, whether the reticle can be used is determined by confirming the oxygen concentration or whether the reticle has been stocked in the reticle stocker 12 for a predetermined period of time. A reticle stocked without any cassette or box is stored and tightly sealed in the highly airtight reticle cassette or box in the reticle stocker 12. A reticle stocked and stored in the highly airtight reticle cassette or box is in an open state and thus is tightly sealed. The tightly sealed reticle is passed through the load-lock chamber 11, and extracted from the reticle stocker 12 while the interior of the highly airtight reticle cassette or box is maintained in a nitrogen atmosphere where the oxygen concentration is low. The highly airtight reticle cassette or box is loaded via the load-lock chamber 11 of the exposure apparatus. As a result, the reticle can be used while the atmosphere around the reticle is kept at a low oxygen concentration, and the efficiency and yield of the exposure apparatus can be increased.

Second Embodiment

Figure 3:
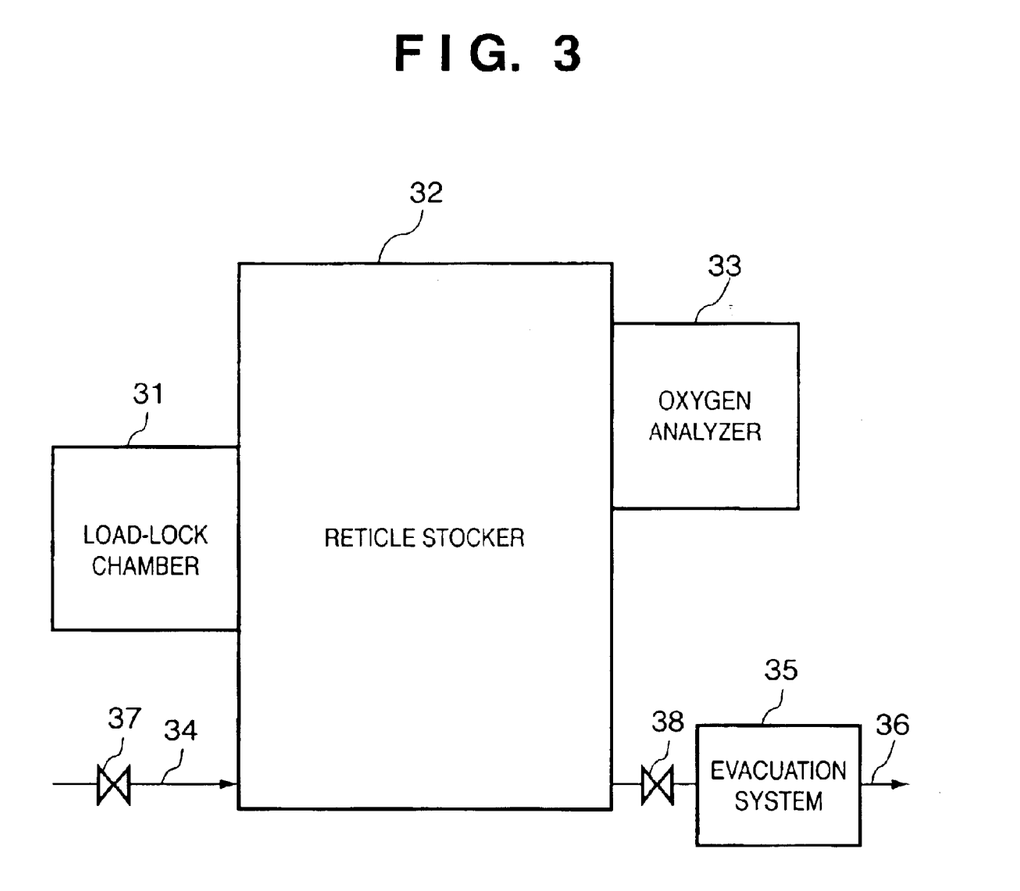
FIG. 3 is a block diagram showing a stocker according to the second embodiment of the present invention.

FIG. 3 shows a reticle stocker according to the second embodiment of the present invention. In FIG. 3, reference numeral 31 denotes a load-lock chamber; 32, a reticle stocker; 33, an oxygen analyzer; 34, a nitrogen injection port; 35, an evacuation system; 36, a discharge port; and 37 and 38, on-off valves, respectively on the injection and discharge sides. In the second embodiment, the reticle stocker 32 has high airtightness corresponding to a vacuum. The oxygen analyzer 33 always monitors the oxygen concentration in the reticle stocker 32. The on-off valve 38 is opened, the interior of the reticle stocker 32 is evacuated, and when the vacuum degree or oxygen concentration reaches a desired value, the on-off valve 38 is closed. After that, the on-off valve 37 is opened to inject nitrogen, and the internal atmosphere is replaced by returning to the atmospheric pressure or a desired pressure. This operation is repeated to rapidly reduce the oxygen concentration in the reticle stocker 32 and to maintain the oxygen concentration at 5 ppm or less. After the oxygen concentration reaches a desired value, the reticle stocker 32 is maintained at this oxygen concentration by continuously supplying nitrogen. If the oxygen concentration exceeds a predetermined level owing to any reason such as loading of a reticle, the oxygen concentration is reduced to a desired level again by atmosphere replacement including evacuation and nitrogen injection.

A reticle is loaded into the reticle stocker 32 via the load-lock chamber 31 together with the highly airtight reticle cassette or box or by itself. The load-lock chamber 31 basically enables loading the reticle into the reticle stocker 32 while preventing an increase in oxygen concentration. In practice, the oxygen at the ppm level is mixed because it is difficult to remove oxygen left at the reticle itself or the fine structure of the highly airtight reticle cassette or box. The oxygen concentration of the reticle stocker 32 increases at the ppm level temporarily or gradually after receiving the reticle. If, however, the oxygen concentration is at an allowable concentration or less, the residual oxygen diffuses with the elapse of time during stocking and is diluted by the flow of nitrogen, thereby reducing the oxygen concentration again. In this case, no atmosphere replacement is done.

The highly airtight reticle cassette or box is opened to replace the internal atmosphere by nitrogen in passing through the load-lock chamber 31. To remove the residual oxygen by diffusion, the highly airtight reticle cassette or box is also opened in the reticle stocker 32.

In the use of a reticle, whether the reticle can be used is determined by confirming the oxygen concentration. A singly stocked reticle is stored and tightly sealed in the highly airtight reticle cassette or box in the reticle stocker 12. A reticle stocked and stored in the highly airtight reticle cassette or box is in an open state and thus is tightly sealed. The tightly sealed reticle is passed through the load-lock chamber 31, and extracted from the reticle stocker 32 while the interior of the highly airtight reticle cassette or box is maintained in a nitrogen atmosphere where the oxygen concentration is low. The highly airtight reticle cassette or box is loaded via the load-lock chamber 31 of the exposure apparatus. Accordingly, the reticle can be used while the atmosphere around the reticle is kept at a low oxygen concentration, and the efficiency and yield of the exposure apparatus can be increased.

Third Embodiment

In the third embodiment of the present invention, the reticle stocker 12 of the first embodiment incorporates a reticle changer. The reticle changer can extract a desired reticle in a highly airtight reticle box and can exchange it with a reticle newly entered via the load-lock chamber 11.

Fourth Embodiment

Figure 4:
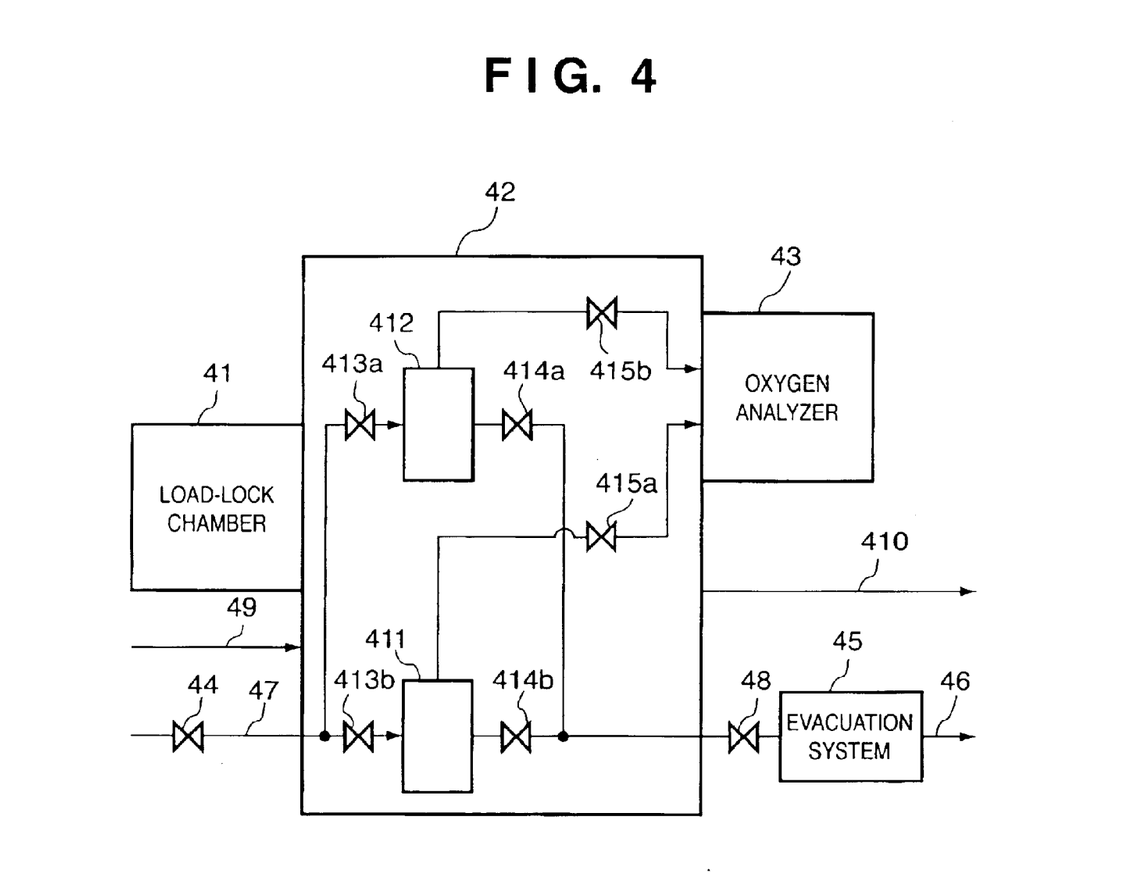
FIG. 4 is a block diagram showing a stocker according to the fourth embodiment of the present invention.

FIG. 4 shows a reticle stocker according to the fourth embodiment of the present invention. In the fourth embodiment, the oxygen concentration of the reticle stocker itself is set to a high allowable value of 50 ppm or less, and the atmospheres of separate highly airtight reticle boxes stocked in the reticle stocker are replaced to manage their oxygen concentrations to 5 ppm or less. Reference numeral 41 denotes a load-lock chamber; 42, a reticle stocker; 43, an oxygen analyzer; 44 and 49, nitrogen injection ports; 45, an evacuation system; 46 and 410, discharge ports; and 47 and 48, on-off valves, respectively on the injection and discharge sides. FIG. 4 shows the internal structure by solid lines wherein two highly airtight reticle boxes 411 and 412 are respectively connected to two docks. The respective docks have gas pipes connected to their own nitrogen injection ports and evacuation systems. Nitrogen injection pipes have injection-side on-off valves 413a and 413b, whereas discharge pipes have discharge-side on-off valves 414a and 414b.

The oxygen analyzer 43 measures the oxygen concentration of the main body of the reticle stocker 42. In addition, the oxygen analyzer 43 periodically extracts the internal atmospheres of the highly airtight reticle boxes 411 and 412 connected to their docks and measures the concentrations. On-off valves 415a and 415b are opened in extracting the internal atmospheres of the highly airtight reticle boxes 411 and 412.

The atmosphere of the main body of the reticle stocker 42 is managed similarly to the first embodiment. Nitrogen is injected from the injection port 49, the discharge port 410 is opened to always generate the flow of nitrogen, and the internal oxygen concentration is kept constant.

Atmosphere replacement of the separate highly airtight reticle boxes 411 and 412 is the same as atmosphere replacement of the reticle stocker in the third embodiment. The on-off valves 414a, 414b, and 48 are opened, the interiors of the highly airtight reticle boxes 411 and 412 are evacuated, and when the vacuum degree or oxygen concentration reaches a desired value, the on-off valves 414a, 414b, and 48 are closed. Then, the on-off valves 413a, 413b, and 47 are opened to inject nitrogen, and the internal atmosphere is replaced by returning to the atmospheric pressure or a desired pressure. This operation is repeated to rapidly reduce the oxygen concentration in the highly airtight reticle boxes 411 and 412. After the oxygen concentration reaches a desired value, the interiors of the highly airtight reticle boxes 411 and 412 are maintained at almost the constant low-level oxygen concentration by continuously supplying nitrogen. If the oxygen concentration exceeds a predetermined level owing to any reason such as diffusion of residual oxygen in the highly airtight reticle boxes 411 and 412, the oxygen concentration is reduced to a desired level again by atmosphere replacement including evacuation and nitrogen injection.

A reticle is loaded into the reticle stocker via the load-lock chamber 41 while stored in the highly airtight reticle box. The load-lock chamber 41 basically enables loading the highly airtight reticle box into the reticle stocker while preventing an increase in oxygen concentration. In practice, oxygen at the ppm level is mixed because it is difficult to remove oxygen left at the fine structure of the highly airtight reticle box. The reticle stocker 42 reduces oxygen by diffusion and the flow of nitrogen. The highly airtight reticle box is mounted in the dock inside the reticle stocker and connected to pipes for injection, discharge, and measurement of the oxygen concentration. After connection, the internal oxygen concentration is reduced by performing atmosphere replacement a plurality of number of times.

In the use of a reticle, whether the reticle can be used is determined by confirming the oxygen concentration. The highly airtight reticle box is tightly sealed in dismounting from the dock. The tightly-sealed highly airtight reticle box is passed through the load-lock chamber 41, and extracted from the reticle stocker 42 while the interior of the highly airtight reticle box is maintained in a nitrogen atmosphere where the oxygen concentration is low. The highly airtight reticle box is loaded via the load-lock chamber of the exposure apparatus. The reticle can be used while the atmosphere around the reticle is kept at a low oxygen concentration, and the efficiency and yield of the exposure apparatus can be increased.

Fifth Embodiment

In the fifth embodiment of the present invention, a highly airtight reticle cassette for storing one reticle is used instead of the highly airtight reticle box in the fourth embodiment, and connected to a pipe.

Sixth Embodiment

The sixth embodiment of the present invention uses helium in place of nitrogen in the above embodiments. Alternatively, a gas mixture of nitrogen and helium may be used.

Seventh Embodiment

The seventh embodiment of the present invention uses inert gas in place of nitrogen in the above embodiments. A general example of inert gas is argon gas, but the inert gas is not limited to this as far as the gas is inert to a process.

Eighth Embodiment

Figure 5:
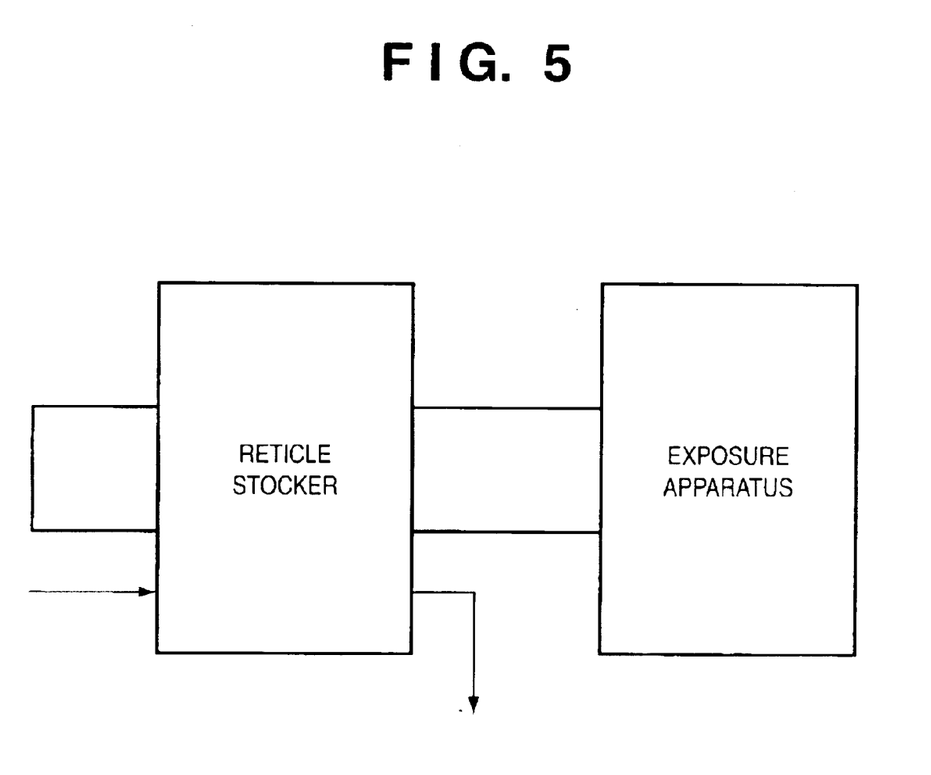
FIG. 5 is a block diagram showing a stocker according to the eighth embodiment of the present invention.

FIG. 5 shows the eighth embodiment of the present invention. In this embodiment, a reticle stocker is connected to an exposure apparatus using an $F_2$ excimer laser as an exposure light source via a highly airtight transfer system path shielded from outer air. After the oxygen concentration is reduced in the stocker, a reticle is transferred to the exposure apparatus without being exposed to outer air.

Ninth Embodiment

In the ninth embodiment of the present invention, a wafer is stocked instead of the reticle in the first embodiment.

Tenth Embodiment

In the tenth embodiment of the present invention, a wafer is stocked instead of the reticle in the third embodiment.

Eleventh Embodiment

In the eleventh embodiment of the present invention, a wafer is stocked instead of the reticle in the sixth embodiment.

Twelfth Embodiment

Figure 2:
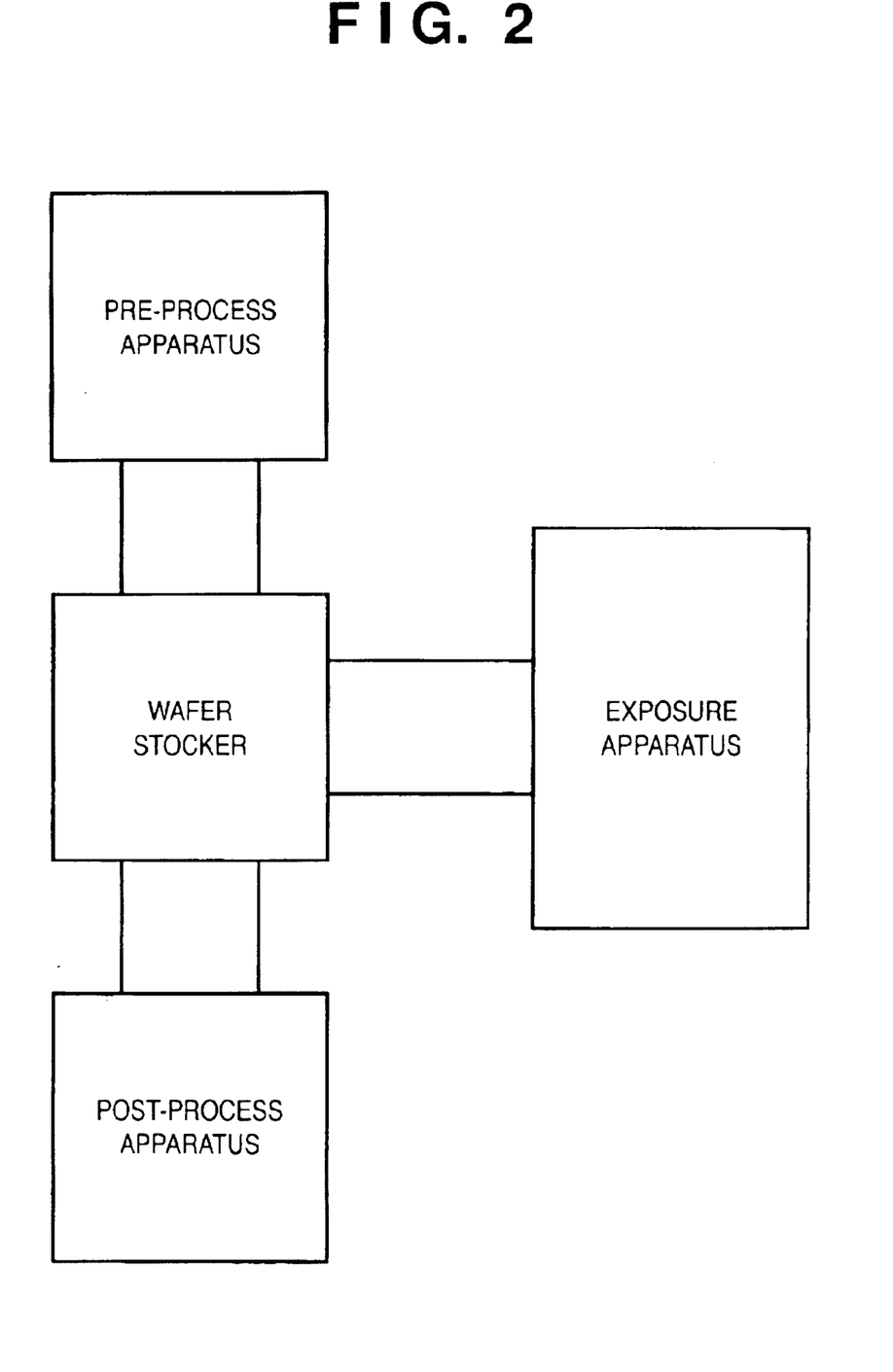
FIG. 2 is a block diagram showing a stocker according to the twelfth embodiment of the present invention.

FIG. 2 shows the twelfth embodiment of the present invention. In this embodiment, a wafer stocker is arranged on a semiconductor manufacturing line. The wafer stocker is connected to an exposure apparatus using an $F_2$ excimer laser as an exposure light source via a highly airtight transfer system path shielded from outer air. After the oxygen concentration is reduced in the stocker, a wafer is transferred to the exposure apparatus without being exposed to outer air.

Embodiment of A Semiconductor Production System

A production system for producing a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 6:
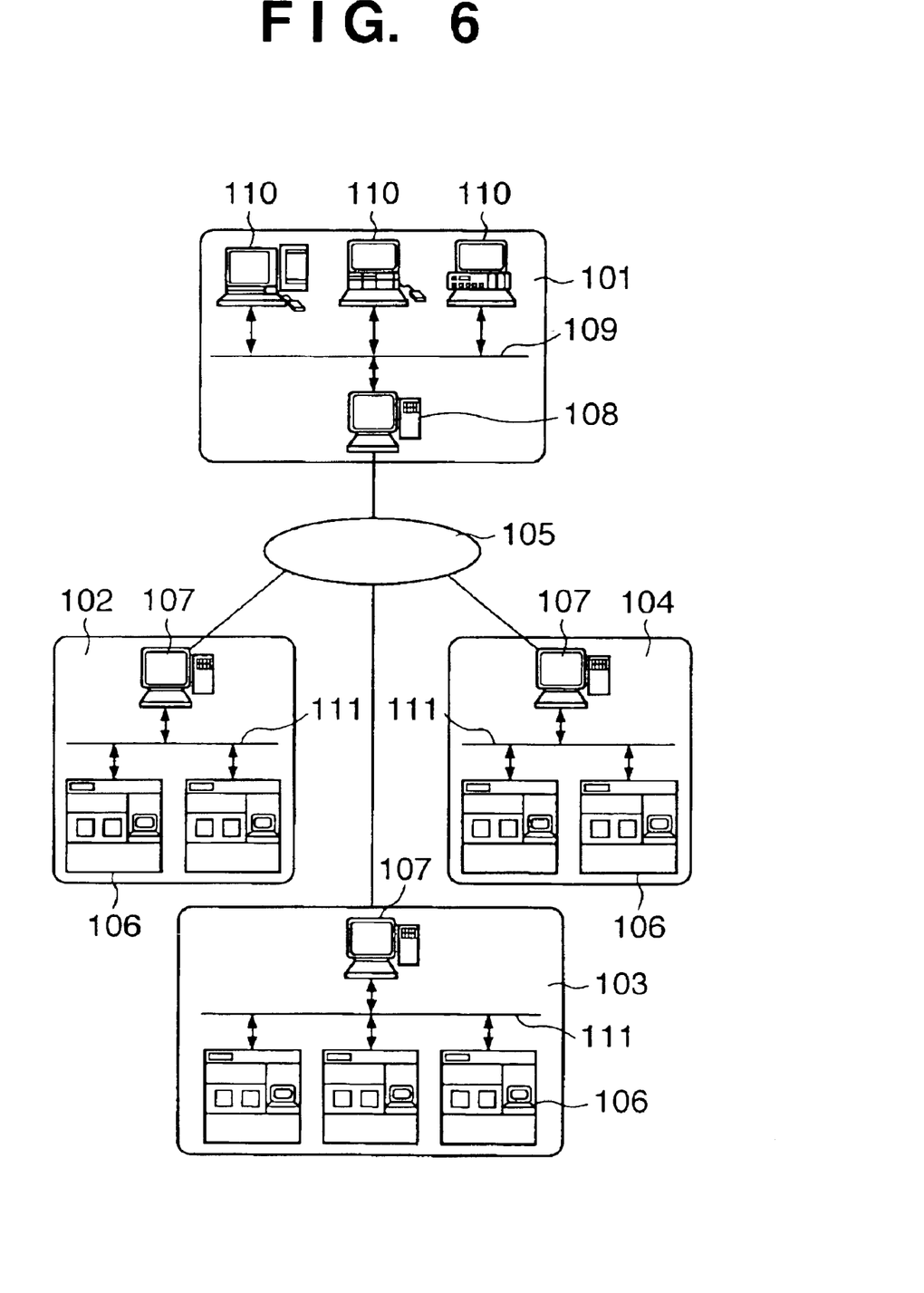
FIG. 6 is a view showing the concept of a semiconductor device production system when viewed from a given angle.

FIG. 6 shows the overall system cut out at a given angle. In FIG. 6, reference numeral 101 denotes a business office of a vendor (e.g., an apparatus supply manufacturer), which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to construct an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. In this system, the factory notifies the vendor via the Internet 105 of status information (e.g., the symptom of a manufacturing apparatus in trouble) representing the operation status of each manufacturing apparatus 106. The vendor can transmit, to the factory, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory typically adopt a communication protocol (TCP/IP) generally used in the Internet. Instead of using the Internet as an external network of the factory, a dedicated-line network (e.g., an ISDN) having high security, which inhibits access of a third party, can be adopted. It may also be possible that the user constructs a database in addition to one provided by the vendor and sets the database on an external network and that the host management system authorizes access to the database from a plurality of user factories.

Figure 7:
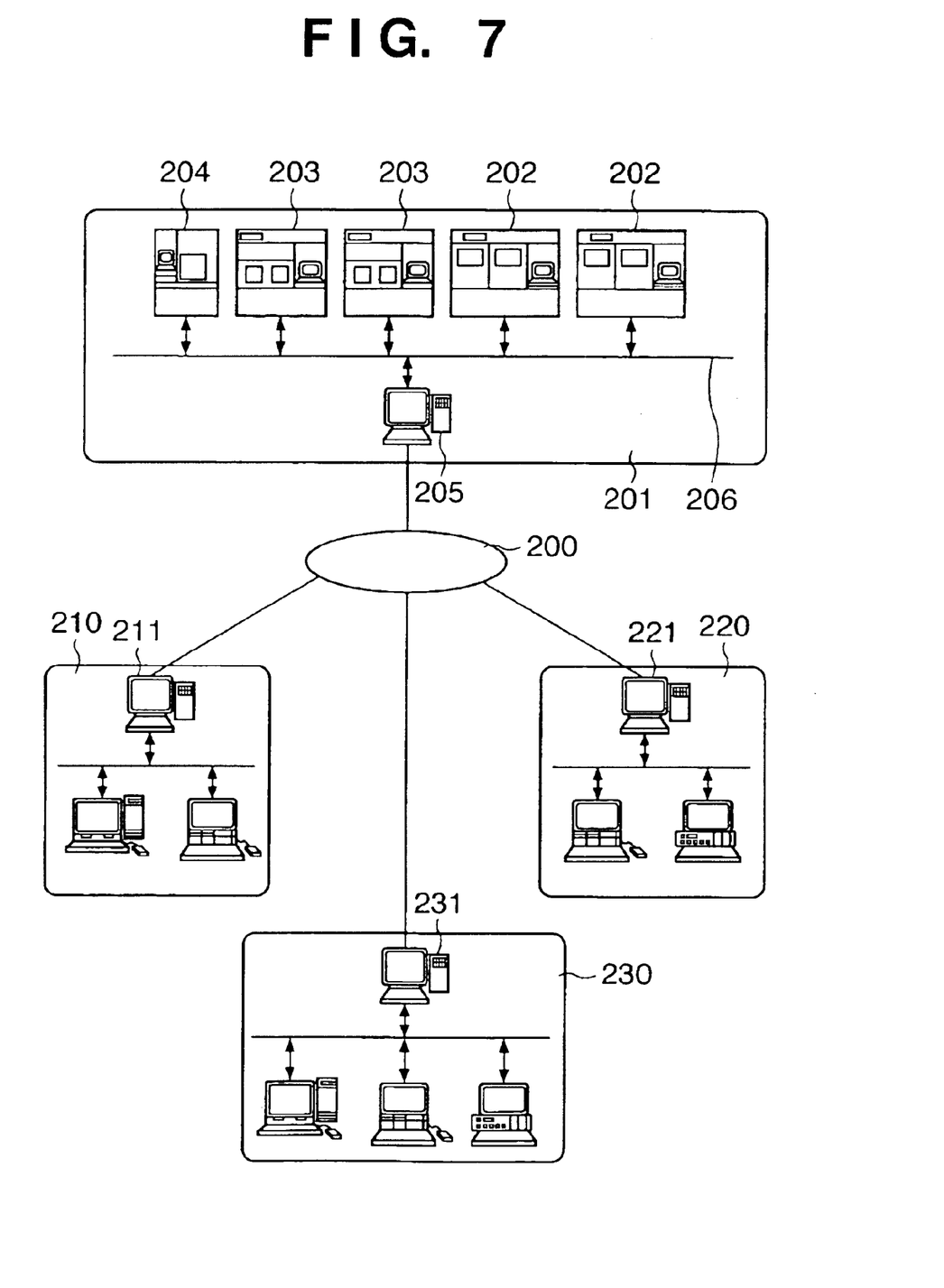
FIG. 7 is a view showing the concept of the semiconductor device production system when viewed from another angle.

FIG. 7 is a view showing the concept of the overall system of this embodiment that is cut out from a different aspect from FIG. 6. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 7, a factory having manufacturing apparatuses of a plurality of vendors, and the management systems of the vendors for these manufacturing apparatuses are connected via the external network of the factory, and maintenance information of each manufacturing apparatus is communicated. In FIG. 7, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 7 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (e.g., apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Figure 8:
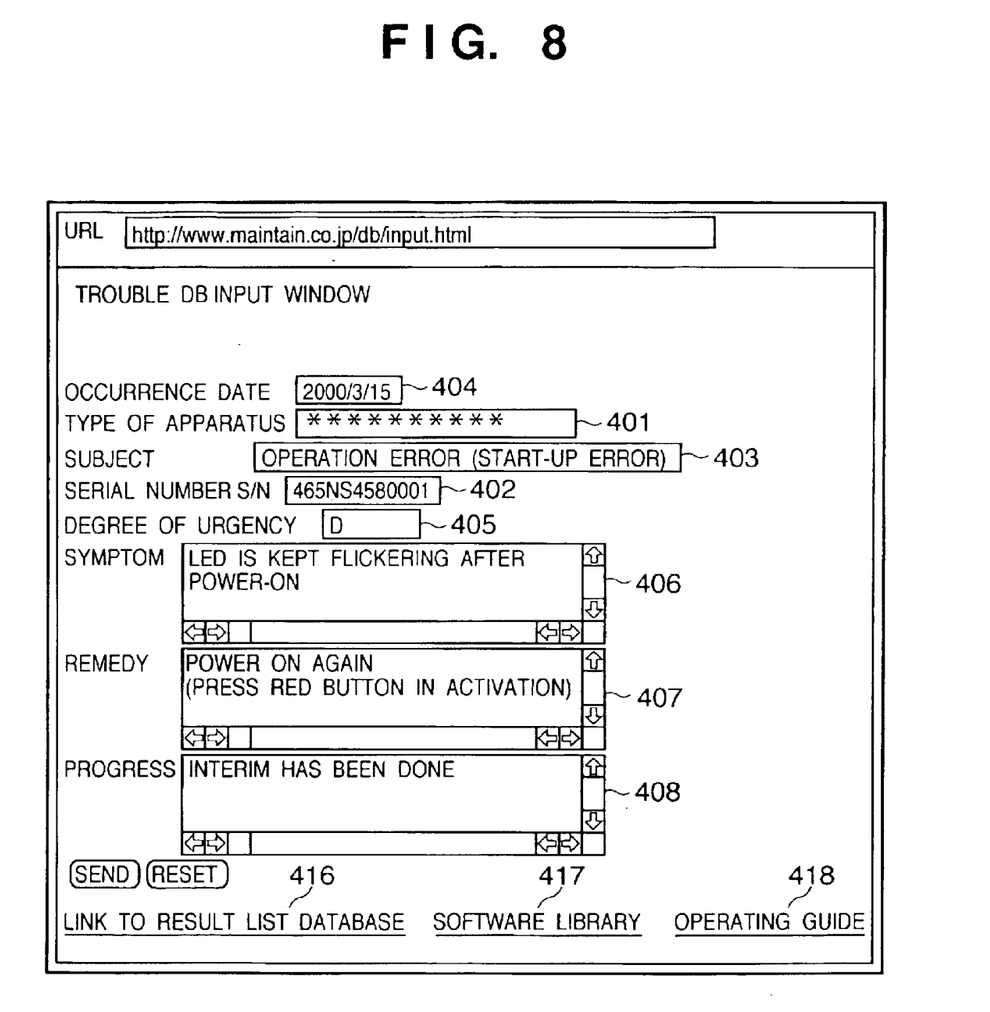
FIG. 8 is a view showing an example of a user interface.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window, as shown in FIG. 8, on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate information is sent back from the maintenance database and displayed on the display. The user interface provided by the web browser realizes hyperlink functions (416 to 418), as shown in FIG. 8. This allows the operator to access detailed information of each item, receive the latest-version software to be used for a manufacturing apparatus from a software library provided by a vendor, and receive an operation guide (help information) as a reference for the operator in the factory.

Figure 9:
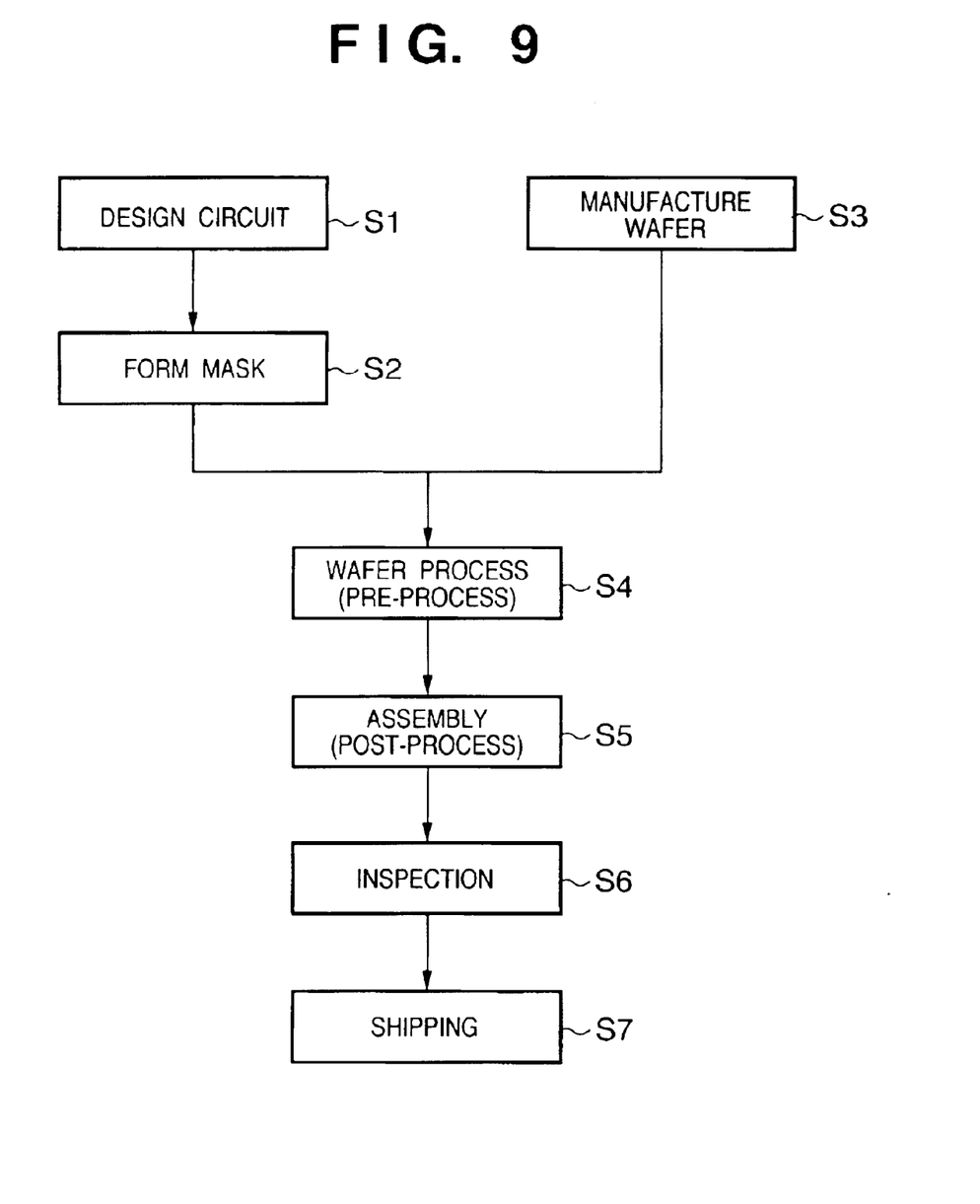
FIG. 9 is a flow chart for explaining the flow of a device manufacturing process.

A semiconductor device manufacturing process using the above-described production system will be explained. FIG. 9 shows the flow of the whole manufacturing process of the semiconductor device. In step 1 (circuit design), a semiconductor device circuit is designed. In step 2 (mask formation), a mask having a designed circuit pattern is formed. In step 3 (wafer manufacture), a wafer is manufactured using a material such as silicon. In step 4 (wafer process), called a pre-process, an actual circuit is formed on the wafer by lithography using a prepared mask and the wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as an operation confirmation test, and a durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

Figure 10:
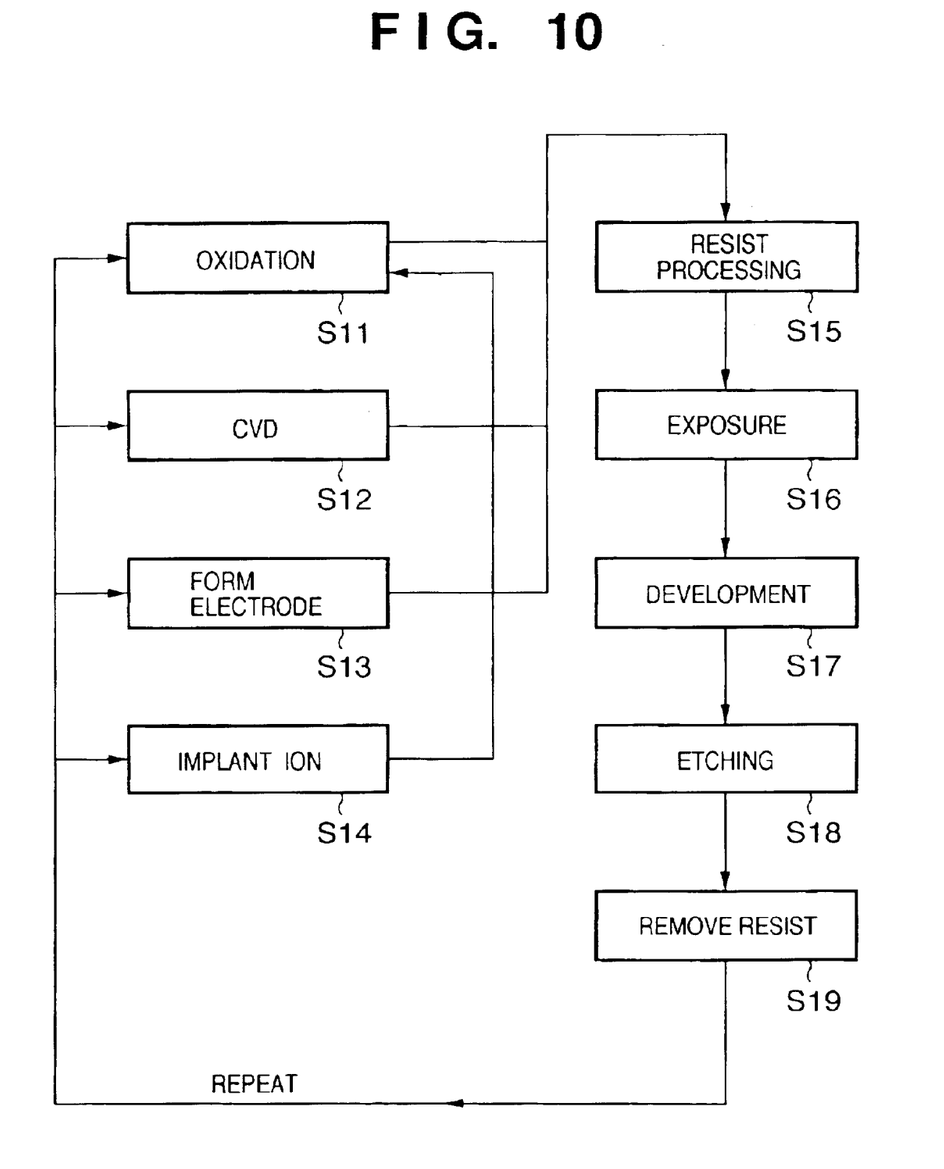
FIG. 10 is a flow chart for explaining a wafer process.

FIG. 10 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus bakes and exposes the circuit pattern of a mask on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the present invention, the oxygen concentration or moisture concentration in a stocker can be quickly reduced, and a reticle, wafer, or the like can be transported to an exposure apparatus after the concentration is satisfactorily reduced. The oxygen concentration or moisture concentration around the reticle or wafer in exposure can be rapidly reduced to 1 ppm or less and easily managed. This can increase the efficiency and yield of the exposure apparatus using an $F_2$ excimer laser as a light source.

As many apparently widely different embodiments of the present invention can be made without departing from the spirit and scope thereof, it is to be understood that the invention is not limited to the specific embodiments thereof except as defined in the appended claims.

What is claimed is:

1. An exposure processing system, comprising:
    an exposure apparatus for exposing a wafer to a pattern on a reticle in a first atmosphere;
    a reticle stocker having a sealing member having a first gate and a second gate, and an atmosphere controller for controlling an interior of the sealing member to a second atmosphere, for stocking the reticle in the second atmosphere;
    a transfer path for transferring the reticle stocked by said reticle stocker from said reticle stocker to said exposure apparatus via said first gate and for transferring the reticle used by said exposure apparatus from said exposure apparatus to said reticle stocker via said first gate; and
    a load-lock chamber for transferring a reticle, which is received from an exterior of said exposure processing system, to said reticle stocker via said second gate, after the reticle is received from the exterior of said exposure processing system and an atmosphere replacement is performed to change an exterior atmosphere to the second atmosphere.

2. The system according to claim 1, wherein said transfer path has a second load-lock chamber for transferring the reticle stocked by said reticle stocker to said exposure apparatus, after the reticle is received from said reticle stocker and an atmosphere replacement is performed to change the second atmosphere to the first atmosphere.

3. The system according to claim 1, wherein said exposure apparatus transfers the pattern on the reticle to the wafer using an $F_2$ excimer laser, and
    wherein an oxygen concentration of the first atmosphere is equal to or less than 1 ppm and an oxygen concentration of the second atmosphere is equal to or less than 50 ppm.

4. The system according to claim 1, wherein said atmosphere controller has evacuation means and inert gas injection means, and repeats alternatively an evacuation by said evacuation means and an inert gas injection by said inert gas injection means.

5. The system according to claim 1, further comprising confirmation means for confirming whether the reticle has been stocked in said reticle stocker for a predetermined time, when the reticle is transferred from said reticle stocker to said exposure apparatus.

6. The system according to claim 1, wherein the reticle is stored in a reticle box,
    wherein said load-lock chamber performs atmosphere replacement to control an external atmosphere of said exposure processing system to the second atmosphere while said reticle box is opened, after the reticle stored in said reticle box is received from an exterior of said exposure processing system, and
    wherein said transfer path transfers the reticle stored in said reticle box from said reticle stocker to said exposure apparatus while said reticle box is closed.

7. The system according to claim 1, wherein the reticle is stored in a reticle box,
    wherein said reticle stocker stocks the reticle stored in said reticle box in said second atmosphere while said reticle box is opened, and
    wherein said transfer path transfers the reticle stored in said reticle box from said reticle stocker to said exposure apparatus while said reticle box is closed.

8. A stocker for stocking a substrate covered with a substrate cover, said stocker comprising:
   a sealing member, having a stocking station within, for storing the substrate covered with said substrate cover, on said stocking station;
   a first atmosphere controller for controlling an interior of said substrate cover of the substrate stored by said stocking station, to a first atmosphere; and
   a second atmosphere controller for controlling a space between an interior of said sealing member and an exterior of said substrate cover of said substrate stored on said stocking station, to a second atmosphere,
   wherein an oxygen concentration of the second atmosphere is higher than an oxygen concentration of the first atmosphere and is lower than an oxygen concentration of an exterior of said sealing member.

9. The stocker according to claim 8, wherein a control of said first atmosphere controller and a control of said second atmosphere controller are performed simultaneously.

10. The stocker according to claim 8, wherein the substrate is used for an exposure process in an atmosphere whose oxygen concentration is equal to or less than 1 ppm, and
   wherein an oxygen concentration of the first atmosphere is equal to or less than 5 ppm and an oxygen concentration of the second atmosphere is equal to or less than 50 ppm.

11. An exposure processing system, comprising:
   an exposure apparatus for performing an exposure process for a substrate covered with a substrate cover in a first atmosphere;
   a substrate stocker having a sealing member, having a stocking station within, for storing the substrate on said stocking station, and having an atmosphere controller for controlling an interior of said substrate cover of the substrate stored on said stocking station to a second atmosphere and for controlling a space between an interior of said sealing member and an exterior of said substrate cover of the substrate stored on said stocking station to a third atmosphere; and
   a transfer path for performing a transfer process for the substrate covered with said substrate cover between said exposure apparatus and said substrate stocker.

12. The system according to claim 11, wherein said exposure apparatus performs the exposure process using an $F_2$ excimer laser, and
   wherein an oxygen concentration of the first atmosphere is equal to or less than 1 ppm, an oxygen concentration of the second atmosphere is equal to or less than 5 ppm and an oxygen concentration of the third atmosphere is equal to or less than 50 ppm.

13. A device manufacturing method comprising:
   a step of performing an exposure process for a wafer using an exposure processing system having:
   (i) an exposure apparatus for exposing a wafer to a pattern on a reticle in a first atmosphere;
   (ii) a reticle stocker having a sealing member having a first gate and a second gate, and an atmosphere controller for controlling an interior of the seating member to a second atmosphere, for stocking the reticle in the second atmosphere;
   (iii) a transfer path for transferring the reticle stocked by the reticle stocker from the reticle stocker to the exposure apparatus via the first gate and for transferring the reticle used by the exposure apparatus from the exposure apparatus to the reticle stocker via the first gate; and
   (iv) a load-lock chamber for transferring a reticle, which is received from an exterior of the exposure processing system, to the reticle stocker via the second gate, after the reticle is received from the exterior of the exposure processing system and an atmosphere replacement is performed to change an exterior atmosphere to the second atmosphere; and
   a step of developing the wafer.

14. A device manufacturing method comprising:
   a step of exposing a wafer to a pattern on a reticle using an exposure processing system having:
   (i) an exposure apparatus for performing an exposure process for a substrate, which is the wafer or the reticle, covered with a substrate cover in a first atmosphere;
   (ii) a substrate stocker having a sealing member, having a stocking station within, for storing the substrate on the stocking station, and having an atmosphere controller for controlling an interior of the substrate cover of the substrate stored on the stocking station to a second atmosphere and for controlling a space between an interior of the sealing member and an exterior of the substrate cover of the substrate stored on the stocking station to a third atmosphere; and
   (iii) a transfer path for performing a transfer process for the substrate covered with the substrate cover between the exposure apparatus, and the substrate stocker; and
   a step of developing the wafer.

* * * * *

UNITED STATES PATENT AND TRADEMARK OFFICE
CERTIFICATE OF CORRECTION

PATENT NO. : 6,826,442 B2
DATED : November 30, 2004
INVENTOR(S) : Seiji Takeuchi et al.

It is certified that error appears in the above-identified patent and that said Letters Patent is hereby corrected as shown below:

Title page,
Item [56], References Cited, U.S. PATENT DOCUMENTS, before the first-listed U.S. patent, insert the following:
-- 4,532,970  A  8/1985   Tullis et al. ........... 141/98
4,534,389  A  8/1985   Tullis ................ 141/98
4,616,683  A  10/1986  Tullis et al. ...........141/98 --.
Insert the following after U.S. PATENT DOCUMENTS:
-- FOREIGN PATENT DOCUMENTS
JP     5-66733          9/1993
       OTHER PUBLICATIONS
   Okabe, H. "Photochemistry of Small Molecules," National Bureau of Standards, Wiley-Interscience Publication (1978), pp. 177-183. --.

Column 2,
Line 31, "on" should read -- one --.

Column 8,
Line 3, "of number" should be deleted.

Column 9,
Line 55, "of" should read -- to --.

Column 10,
Line 3, "of" should read -- to --.

Signed and Sealed this

Twenty-sixth Day of April, 2005

JON W. DUDAS
*Director of the United States Patent and Trademark Office*